(12) United States Patent
Zhu et al.

(10) Patent No.: US 10,797,178 B2
(45) Date of Patent: Oct. 6, 2020

(54) MULTI-GATE FINFET INCLUDING NEGATIVE CAPACITOR, METHOD OF MANUFACTURING THE SAME, AND ELECTRONIC DEVICE

(71) Applicant: Institute of Microelectronics, Chinese Academy of Sciences, Beijing (CN)

(72) Inventors: Huilong Zhu, Poughkeepsie, NY (US); Zhengyong Zhu, Beijing (CN)

(73) Assignee: Institute of Microelectronics Chinese Academy of Sciences, Beijing (CN)

( * ) Notice: Subject to any disclaimer, the term of this patent is extended or adjusted under 35 U.S.C. 154(b) by 0 days.

(21) Appl. No.: 16/054,809

(22) Filed: Aug. 3, 2018

(65) Prior Publication Data

US 2018/0342622 A1    Nov. 29, 2018

Related U.S. Application Data

(63) Continuation of application No. PCT/CN2016/087249, filed on Jun. 27, 2016.

(30) Foreign Application Priority Data

Feb. 5, 2016   (CN) .......................... 2016 1 0082481

(51) Int. Cl.
*H01L 29/78*    (2006.01)
*H01L 21/82*    (2006.01)
(Continued)

(52) U.S. Cl.
CPC .. *H01L 29/7855* (2013.01); *H01L 21/823431* (2013.01); *H01L 21/845* (2013.01);
(Continued)

(58) Field of Classification Search
CPC ........... H01L 29/7855; H01L 29/66484; H01L 29/66795; H01L 29/7831
(Continued)

(56) References Cited

U.S. PATENT DOCUMENTS 8,217,435 B2   7/2012   Chang et al.
8,569,812 B2  10/2013   Chang et al.
(Continued)

FOREIGN PATENT DOCUMENTS

CN    1779976 A    5/2006
CN    1893114 A    1/2007
(Continued)

OTHER PUBLICATIONS

Negative Capacitance in Short-Channel FinFETs Externally Connected to an Epitaxial Ferroelectric Capacitor, IEEE Electron Device Letters, vol. 37, No. 1, pp. 111-114, Nov. 18, 2015 (Year: 2015).*
(Continued)

*Primary Examiner* — Sheikh Maruf
(74) *Attorney, Agent, or Firm* — Knobbe, Martens, Olson & Bear, LLP

(57) ABSTRACT

There are provided a multi-gate FinFET including a negative capacitor connected to one of its gates, a method of manufacturing the same, and an electronic device comprising the same. The FinFET may include a fin extending in a first direction on a substrate, a first gate extending in a second direction crossing the first direction on the substrate on a first side of the fin to intersect the fin, a second gate opposite to the first gate and extending in the second direction on the substrate on a second side of the fin opposite to the first side to intersect the fin, a metallization stack provided on the substrate and above the fin and the first and second gates, and a negative capacitor formed in the metallization stack and connected to the second gate.

17 Claims, 17 Drawing Sheets

(51) Int. Cl.
  *H01L 21/8234* (2006.01)
  *H01L 27/12* (2006.01)
  *H01L 29/66* (2006.01)
  *H01L 21/84* (2006.01)
  *H01L 27/088* (2006.01)
  *H01L 29/10* (2006.01)

(52) U.S. Cl.
  CPC ...... *H01L 27/0886* (2013.01); *H01L 27/1211* (2013.01); *H01L 29/66484* (2013.01); *H01L 29/66545* (2013.01); *H01L 29/66795* (2013.01); *H01L 29/7831* (2013.01); *H01L 29/1083* (2013.01)

(58) Field of Classification Search
  USPC ........................................................ 257/401
  See application file for complete search history.

(56) References Cited

U.S. PATENT DOCUMENTS

| | | | |
|---|---|---|---|
| 8,980,707 B2 | 3/2015 | Chang et al. | |
| 9,275,999 B2 | 3/2016 | Chang et al. | |
| 9,418,997 B2 | 8/2016 | Chang et al. | |
| 9,520,399 B2 | 12/2016 | Chang et al. | |
| 9,646,970 B2 | 5/2017 | Chang et al. | |
| 9,786,667 B2 | 10/2017 | Chang et al. | |
| 10,121,792 B2 | 11/2018 | Chang et al. | |
| 2005/0167725 A1* | 8/2005 | Nagano | H01L 28/57 257/309 |
| 2005/0266645 A1* | 12/2005 | Park | H01L 29/66636 438/282 |
| 2006/0108621 A1 | 5/2006 | Hayashi et al. | |
| 2007/0004049 A1 | 1/2007 | Nasu et al. | |
| 2008/0149984 A1* | 6/2008 | Chang | H01L 27/108 257/314 |
| 2009/0127625 A1* | 5/2009 | Ohguro | H01L 29/785 257/365 |
| 2009/0321801 A1 | 12/2009 | Hayashi et al. | |
| 2012/0091538 A1* | 4/2012 | Lin | H01L 29/66636 257/401 |
| 2012/0139028 A1* | 6/2012 | Park | H01L 27/10876 257/324 |
| 2012/0175696 A1* | 7/2012 | Franzon | H01L 29/42332 257/316 |
| 2012/0181605 A1* | 7/2012 | Grisham | H01L 21/823431 257/330 |
| 2012/0217559 A1* | 8/2012 | Kim | H01L 27/10855 257/296 |
| 2012/0267721 A1 | 10/2012 | Chang et al. | |
| 2014/0015021 A1 | 1/2014 | Chang et al. | |
| 2014/0106523 A1* | 4/2014 | Koldiaev | H01L 21/845 438/212 |
| 2014/0319623 A1* | 10/2014 | Tsai | H01L 29/7855 257/401 |
| 2015/0179650 A1 | 6/2015 | Chang et al. | |
| 2015/0194422 A1* | 7/2015 | Liu | H01L 29/4175 257/383 |
| 2015/0221770 A1* | 8/2015 | van Meer | H01L 29/66795 257/401 |
| 2015/0228544 A1* | 8/2015 | Lin | H01L 21/845 257/401 |
| 2015/0294969 A1* | 10/2015 | Lee | H01L 29/0692 257/401 |
| 2015/0303277 A1* | 10/2015 | Chang | H01L 21/763 257/401 |
| 2015/0311349 A1* | 10/2015 | Ramaswamy | H01L 29/6684 257/295 |
| 2015/0318285 A1* | 11/2015 | Zhang | H01L 27/10844 257/295 |
| 2015/0333072 A1* | 11/2015 | Li | H01L 27/112 365/182 |
| 2015/0380504 A1* | 12/2015 | Nagai | H01L 29/4238 257/401 |
| 2016/0049486 A1* | 2/2016 | Blank | H01L 29/66666 257/330 |
| 2016/0141417 A1* | 5/2016 | Park | H01L 29/66545 257/365 |
| 2016/0155742 A1 | 6/2016 | Chang et al. | |
| 2016/0155748 A1* | 6/2016 | Li | H01L 29/66545 257/295 |
| 2016/0155843 A1* | 6/2016 | Steigerwald | H01L 29/7855 257/365 |
| 2016/0322360 A1 | 11/2016 | Chang et al. | |
| 2016/0322503 A1* | 11/2016 | Tezuka | H01L 27/1255 |
| 2016/0336312 A1* | 11/2016 | Yan | H01L 27/0711 |
| 2017/0004975 A1* | 1/2017 | Farmer | H01L 29/66795 |
| 2017/0040172 A1* | 2/2017 | Moon | C23C 16/045 |
| 2017/0062434 A1 | 3/2017 | Chang et al. | |
| 2017/0084741 A1* | 3/2017 | Lin | H01L 29/7842 |
| 2017/0092638 A1* | 3/2017 | Jung | H01L 27/0292 |
| 2017/0207222 A1 | 7/2017 | Chang et al. | |
| 2018/0053830 A1* | 2/2018 | Cheng | H01L 29/6653 |
| 2018/0076334 A1* | 3/2018 | Ando | H01L 29/40111 |
| 2018/0151745 A1* | 5/2018 | Chang | H01L 21/823431 |
| 2018/0226407 A1 | 8/2018 | Chang et al. | |
| 2018/0342622 A1 | 11/2018 | Zhu et al. | |
| 2019/0035790 A1 | 1/2019 | Chang et al. | |

FOREIGN PATENT DOCUMENTS

| | | |
|---|---|---|
| CN | 101207155 A | 6/2008 |
| CN | 104112748 A | 10/2014 |
| CN | 105702737 A | 6/2016 |

OTHER PUBLICATIONS

Khan et al. "Negative Capacitance in Short-Channel FinFETs Externally Connected to an Epitaxial Ferroelectric Capacitor" IEEE Electro Device Letters, vol. 37, No. 1, Jan. 2016.

International Search Report and Written Opinion with Translation for International Application No. PCT/CN2016/087249 dated Nov. 10, 2016, which corresponds in priority to above-identified subject U.S. Application.

Office Action with Translation for Chinese Application No. 201610082481.4 dated Feb. 24, 2018, which corresponds in priority to above-identified subject U.S. Application.

International Search Report for International Application No. PCT/CN2016/087249 dated Nov. 10, 2016.

* cited by examiner

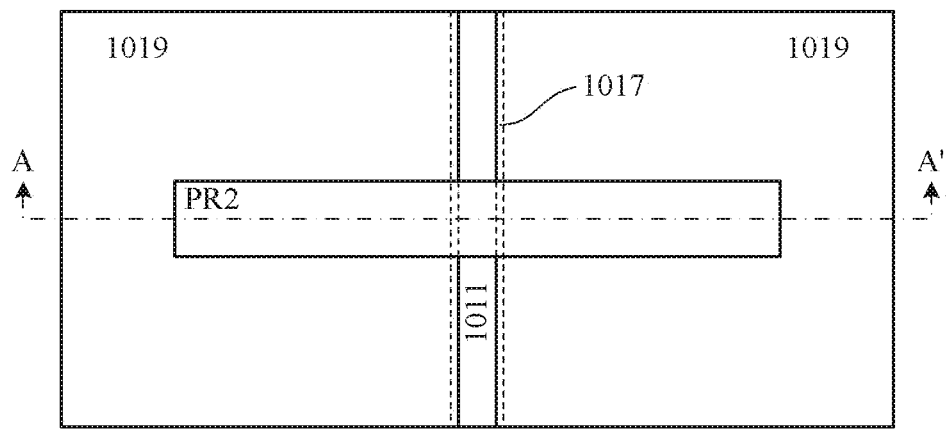
FIG. 2(i)
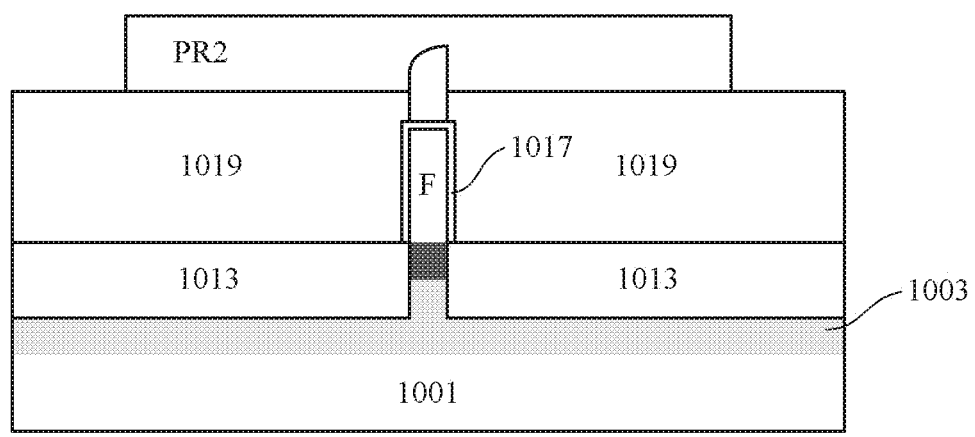
FIG. 2(i')

FIG. 3(f')

MULTI-GATE FINFET INCLUDING NEGATIVE CAPACITOR, METHOD OF MANUFACTURING THE SAME, AND ELECTRONIC DEVICE

CROSS-REFERENCE TO RELATED APPLICATION(S)

This application is a continuation of International App. PCT/CN2016/087249, which claims priority to Chinese Patent Application No. 201610082481.4, filed on Feb. 5, 2016, entitled "MULTI-GATE FINFET WITH NEGATIVE CAPACITOR CONNECTED THERETO, METHOD OF MANUFACTURING THE SAME, AND ELECTRONIC DEVICE." Each of the above-recited applications are hereby incorporated herein by reference in their entireties.

BACKGROUND OF THE INVENTION

Field of the Invention

The present disclosure relates to the field of semiconductors, and more particularly, to a multi-gate Fin Field Effect Transistor (FinFET) including a negative capacitor connected to one of its gates, a method of manufacturing the same, and an electronic device comprising the FinFET.

Description of the Related Art

The Sub-threshold Swing (SS) is an important performance parameter of Metal Oxide Semiconductor Field Effect Transistors (MOSFETs), which is greater than zero. It is desirable to reduce the SS as much as possible. Currently, the SS has a limit value of about 60 mV/dec at the room temperature, and is difficult to be further decreased as the device is scaled down. It is desirable to achieve a smaller SS to improve the device performance.

SUMMARY OF THE INVENTION

The present disclosure aims to provide, among others, a Field Effect Transistor (FinFET) having a plurality of gates, one of which is connected to a negative capacitor, a method of manufacturing the same, and an electronic device comprising the FinFET.

According to an aspect of the present disclosure, there is provided a FinFET, comprising: a fin extending in a first direction on a substrate; a first gate extending in a second direction crossing the first direction on the substrate on a first side of the fin to intersect the fin; a second gate opposite to the first gate and extending in the second direction on the substrate on a second side of the fin opposite to the first side to intersect the fin; a metallization stack provided on the substrate and above the fin and the first and second gates; and a negative capacitor formed in the metallization stack and connected to the second gate.

According to another aspect of the present disclosure, there is provided an electronic device comprising an integrated circuit formed of the FinFET.

According to yet another aspect of the present disclosure, there is provided a method of manufacturing a FinFET, comprising: forming, on a substrate, a fin extending in a first direction; forming, on the substrate, a first gate and a second gate opposite to the first gate extending in a second direction crossing the first direction respectively on a first side and a second side of the fin to intersect the fin; providing a metallization stack on the substrate and above the fin and the first and second gates; and forming, in the metallization stack, a negative capacitor connected to the second gate.

According to embodiments of the present disclosure, the first gate and the second gate which are separate from each other may be formed for the FinFET (for example, a bulk FinFET or an SOI FinFET), and the negative capacitor may be connected to the second gate. With this negative capacitor, total capacitance at the second gate may be negative, so that the Sub-threshold Swing (SS) can be effectively reduced. On the other hand, the first gate may have no negative capacitor connected thereto. The off current can be effectively reduced by the first gate.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION OF THE PREFERRED EMBODIMENT

Figure 1:
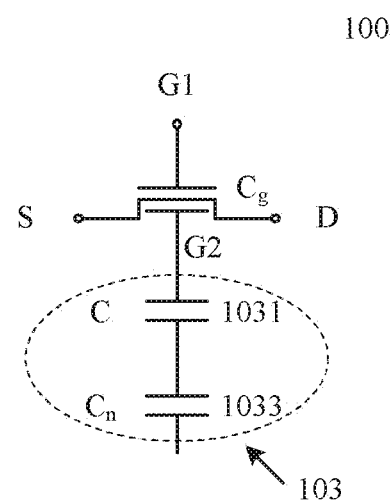
FIG. 1 is a schematic circuit diagram illustrating a Fin Field Effect Transistor (FinFET) according to an embodiment of the present disclosure.

Hereinafter, embodiments of the present disclosure will be described with reference to the attached drawings. However, it should be understood that those descriptions are provided for illustrative purpose only, rather than limiting the scope of the present disclosure. Further, in the following, descriptions of known structures and techniques might be omitted so as not to obscure the concept of the present disclosure.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances or technique limitations in practice. Those skilled in the art can also devise regions/layers of different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

FIG. 1 is a schematic circuit diagram illustrating a Fin Field Effect Transistor (FinFET) according to an embodiment of the present disclosure.

As shown in FIG. 1, the FinFET 100 according to the embodiment comprises a first gate (G1), a second gate (G2), a source (S), and a drain (D). Here, the FinFET 100 is formed in a multi-gate structure. For example, the first gate G1 may be a control gate, and the second gate G2 may be a back gate, and vice versa. According to an embodiment of the present disclosure, the FinFET 100 may comprise a fin extending in a first direction on a substrate, and the first gate G1 and the second gate G2 may extend in a second direction crossing the first direction to intersect the fin. The first gate and the second gate are opposite to each other, and each can affect a channel region formed in the fin. A source region S and a drain region D may be formed on opposite sides of the channel region, for example, at opposite ends of the fin or in other semiconductor layers epitaxially grown at the ends of the fin. Here, the first gate and the second gate may be substantially aligned with each other in the second direction and spaced apart from each other (for example, by the fin therebetween and optionally also by a dielectric layer on the top of the fin).

According to an embodiment of the present disclosure, the first gate G1 and the second gate G2 may have substantially the same stack configuration. For example, each of the first gate G1 and the second gate G2 may comprise a stack of a gate dielectric layer and a gate electrode layer (for example, a high-K/metal gate stack). According to an embodiment, a work function adjustment layer may be interposed between the gate dielectric layer and the gate electrode layer.

As is known to those skilled in the art, the first gate G1 (especially a gate dielectric layer therein) may result in a first gate capacitor, denoted here by $C_g$; and likewise, the second gate (especially a gate dielectric layer therein) may result in a second gate capacitor 1031, denoted here by C. The first gate capacitor $C_g$ and the second gate capacitor C are capacitors inherent to the device.

According to an embodiment of the present disclosure, a negative capacitor 1033 may be connected in series to the second gate G2. Therefore, the negative capacitor 1033 appears to be connected in series to the second gate capacitor 1031. Generally, the capacitor comprises a configuration of a plate-a dielectric layer-a plate in which the dielectric layer may store charges. Conventional capacitors have a "positive" capacitance characteristic, that is, as the charges stored in the dielectric layer increase, a voltage between the two plates increases. In the present disclosure, such a dielectric layer is referred to as a conventional dielectric layer, or is simply referred to as a dielectric layer, as is conventional in the art. In contrast, certain materials may exhibit a "negative" capacitance characteristic in certain conditions, that is, as the charges stored therein increase, the voltage between the plates decreases. Such materials are referred to as "negative capacitance materials." For example, some ferroelectric materials (for example, materials containing Zr, Ba, or Sr, such as $HfZrO_2$, $BaTiO_3$, $KH_2PO_4$, or NBT, or any combination thereof) may be polarized if a critical electric field is reached. The polarization results in that a large amount of bound charges are accumulated instantaneously on a surface of the material, thereby causing a voltage across the ferroelectric material to decrease.

Due to the series relationship, a total capacitance $C_t$ at the second gate G2 may be expressed as:

$$C_t = |C_n|C/(|C_n|-C),$$

where C is a capacitance value of the second gate capacitor 1031, $C_n$ is a capacitance value of the negative capacitor 1033 (which is a negative value as described above), and $|C_n|$ represents an absolute value of $C_n$.

If the first gate G1 is a control gate (in this case, the second gate G2 may be a back gate), the Sub-threshold Swing (SS) may be expressed as:

$$SS \approx 60(1+C_t/C_g) \text{ mV/dec}.$$

As can be seen from the above equation, when $C_t<0$, the SS less than 60 mV/dec may be achieved. Therefore, preferably, $|C_n|<C$. In addition, when the SS is greater than zero, the smaller is the value of the SS, the better is the device performance. Therefore, preferably, $|C_t|$ is approximately equal to (or slightly less than) $C_g$. At this time, $(1/C_t+1/C_g)$ is less than zero, and therefore a total capacitance between the first gate G1 and the second gate G2 is less than zero. At this time, the transistor is unstable, that is, the transistor has hysteresis.

Alternatively, if the second gate G2 is a control gate (in this case, the first gate G1 may be a back gate), the SS may be expressed as:

$$SS \approx 60(1+C_g/C_t) \text{ mV/dec}.$$

It can be seen from the above equation that when $C_t<0$, the SS less than 60 mV/dec may also be achieved. Therefore, preferably, $|C_n|<C$. Similarly, when the SS is greater than zero, the smaller is the value of the SS, the better is the device performance. Therefore, preferably, $|C_t|$ is approximately equal to (or slightly greater than) $C_g$. At this time, $(1/C_t+1/C_g)$ is greater than zero, and therefore the total capacitance between the first gate G1 and the second gate G2 is greater than zero. At this time, the transistor is stable and has no hysteresis, which is a preferred operation state of the transistor.

According to an embodiment of the present disclosure, the negative capacitor may be formed in a form of a trench capacitor. In a limited area, the trench capacitor may have an area of its opposite plates increased and thus an increased capacitance value. For example, a trench may be formed in one or more layers of a metallization stack and a negative capacitor may be formed in the trench (for example, by forming a stack of a first conductive layer-a negative capacitance material layer-a second conductive layer in the trench). The layers in the stack configuration of the capacitor may extend on side and bottom walls of the trench.

Each of the conductive layers (the first conductive layer, the second conductive layer, etc.) may comprise various suitable conductive materials such as metal, metal nitride, or the like, or a stack configuration thereof. In order to be more compatible with the semiconductor processes, the conductive material may comprise materials for forming conductive contacts in the semiconductor processes, for example, conductive diffusion barrier materials such as TiN or the like and metal electrode materials such as W or the like. The metal electrode materials can form a low ohmic contact, and thus are suitable to form a conductive layer which requires a connection with other components. Further, in order to avoid diffusion of the metal electrode materials, a conductive diffusion barrier material layer may be used in conjunction therewith.

Such a FinFET may be manufactured as follows. For example, a fin extending in a first direction may be formed on a substrate. The substrate may be a bulk semiconductor substrate or a Semiconductor-On-Insulator (SOI) substrate. A first gate extending in a second direction crossing the first direction may be formed on the substrate on a first side of the fin to intersect the fin, and a second gate opposite to the first gate and extending in the second direction may be formed on the substrate on a second side of the fin opposite to the first side to intersect the fin.

In a case that the first gate and the second gate have substantially the same stack configuration, they may be manufactured in the same process. For example, a stack for the gates may be formed on the substrate having the fin formed thereon (on both the first side and the second side of the fin), and then the stack is divided into two portions on the first side and the second side of the fin (for example, this may be achieved simply by etching the stack back). The stack which has been divided may then be patterned into a final gate shape. During the patterning, the first gate and the second gate may be substantially self-aligned in the second direction by using one same mask extending in the second direction across the fin.

Certainly, the present disclosure is not limited thereto. For example, the first gate and the second gate may have different stack configurations. In this case, different processes may be conducted on the first side and the second side of the fin respectively. For example, a stack for the first gate may be formed on the first side, a stack for the second gate may be formed on the second side, and both of the stacks are patterned into a final gate shape. There are various ways in the art to form different materials in different regions on the substrate.

According to an embodiment, the replacement gate process may be used. Specifically, a sacrificial gate extending in the second direction may be formed on the substrate to intersect the fin. The sacrificial gate may comprise a first portion on the first side of the fin and a second portion on the second side of the fin. The first portion of the sacrificial gate may be removed (by, for example, selective etching) to form a first gate in a space left by the removal of the first portion; and the second portion of the sacrificial gate may be removed (by, for example, selective etching) to form a second gate in a space left by the removal of the second portion. As described above, in a case that the first gate and the second gate have substantially the same stack configuration, the first portion and the second portion of the sacrificial gate may be formed of the same sacrificial material layer, their removal may be performed simultaneously using the same etching recipe, and the filling of the first gate and the second gate in the spaces left by their removal may also be performed simultaneously.

For the second gate, a negative capacitor connected in series thereto may be formed. For example, the negative capacitor may be formed in a metallization stack (for example, in a form of a trench capacitor) and may be connected to the second gate through a metallization interconnection.

The techniques of the present disclosure may be presented in various ways, some of which will be described below.

Figure 2A:
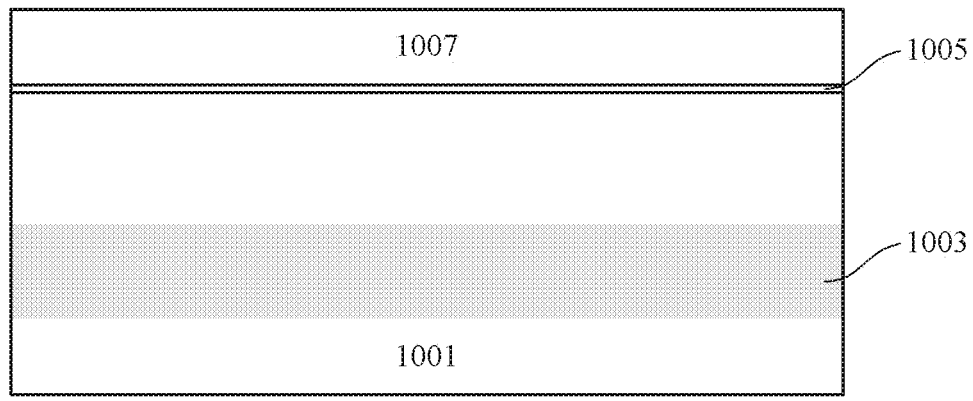
FIGS. 2(a)-2(q) are sectional views illustrating some of phases in a flow of manufacturing a FinFET according to an embodiment of the present disclosure.
Figure 2B:
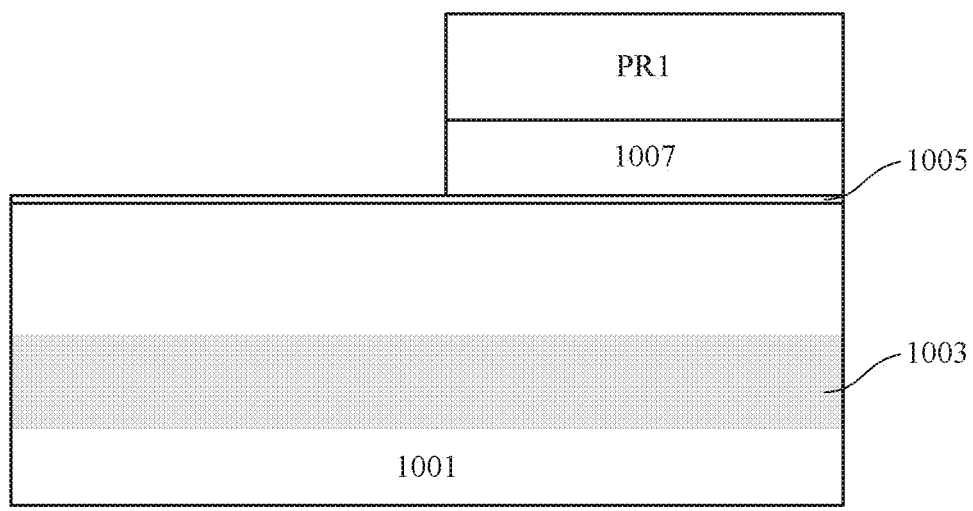
Figure 2C:
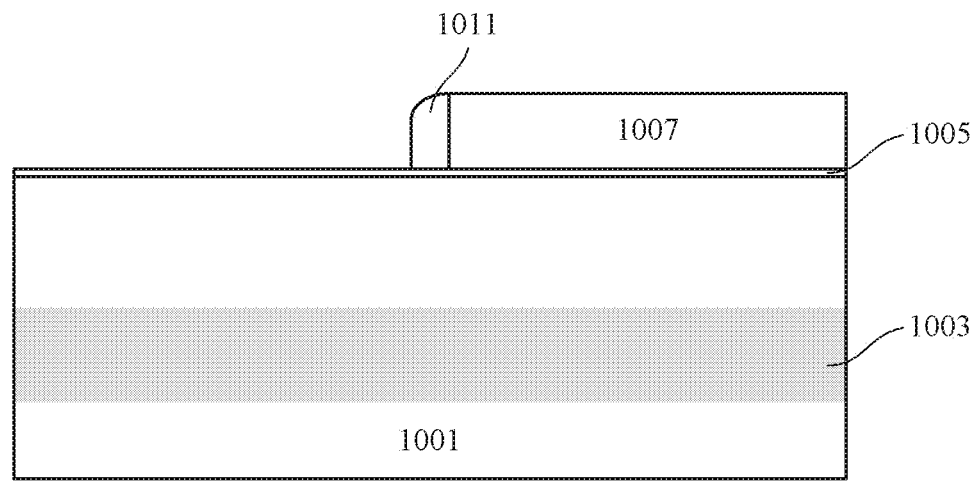
Figure 2D:
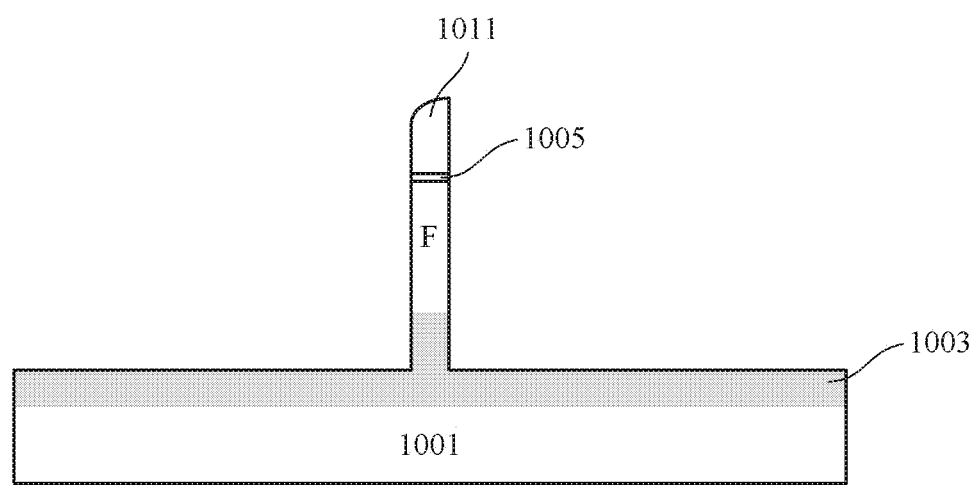
Figure 2E:
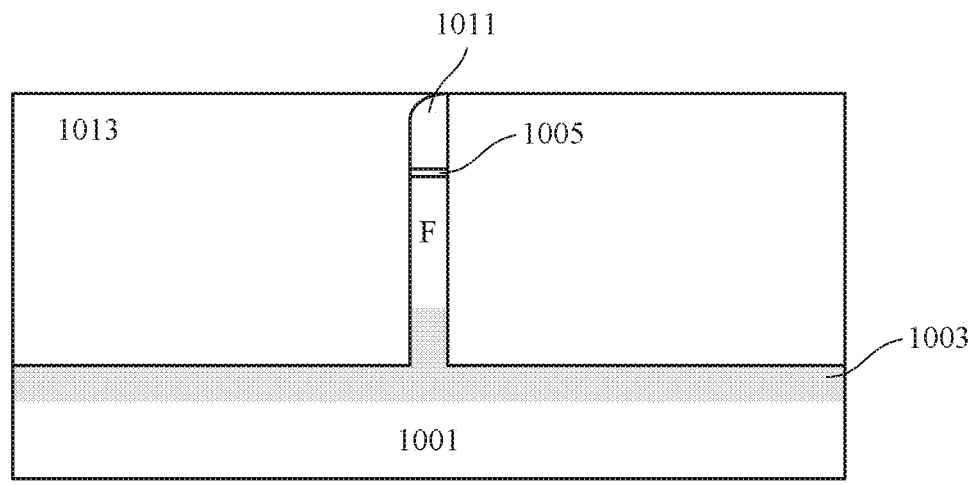
Figure 2F:
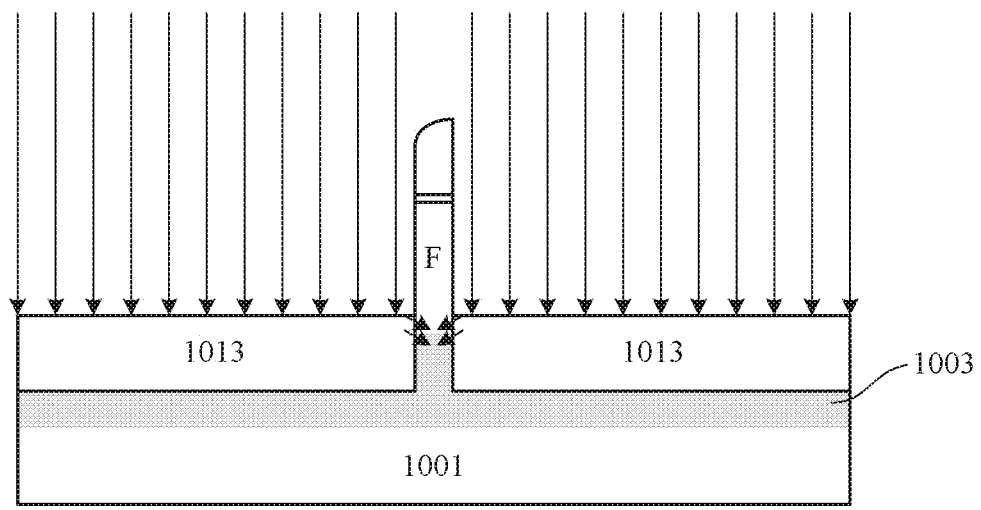
Figure 2G:
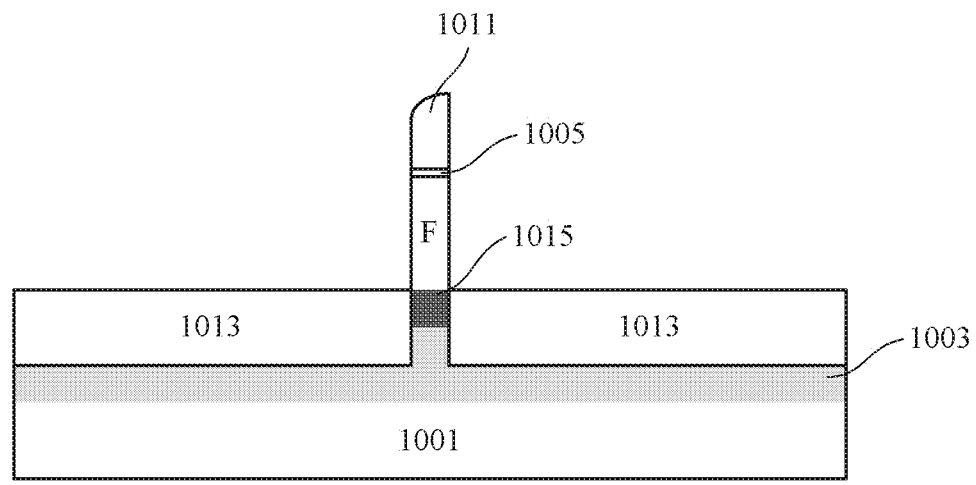
Figure 2H:
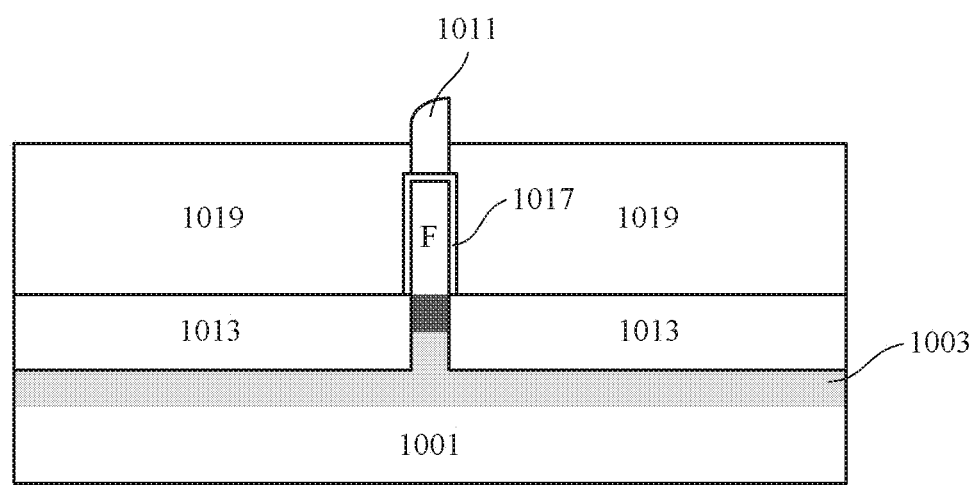
Figure 2J:
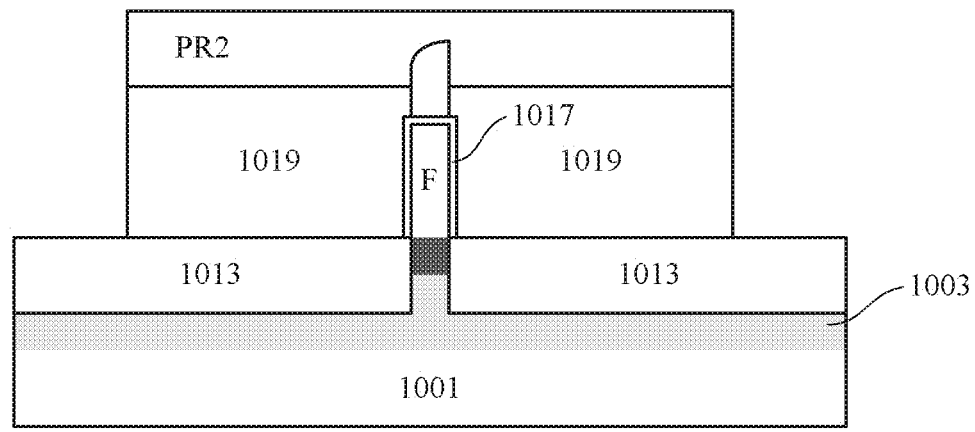
Figure 2K:
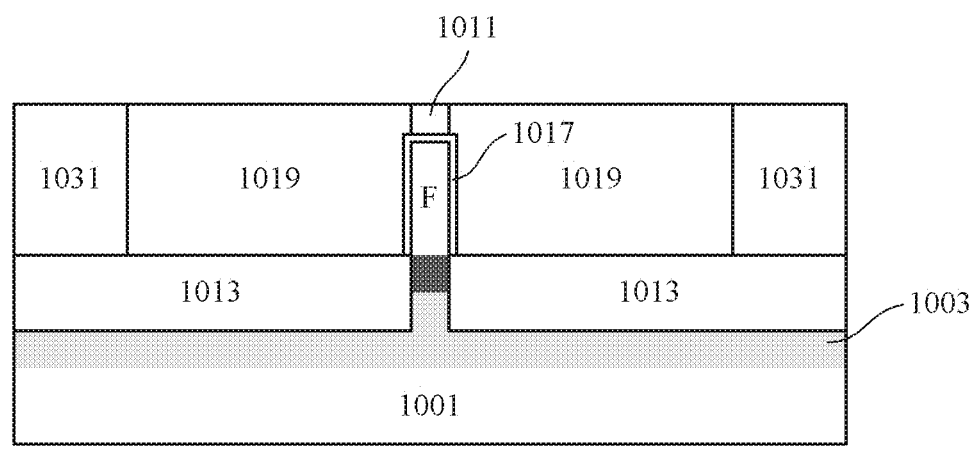
Figure 2L:
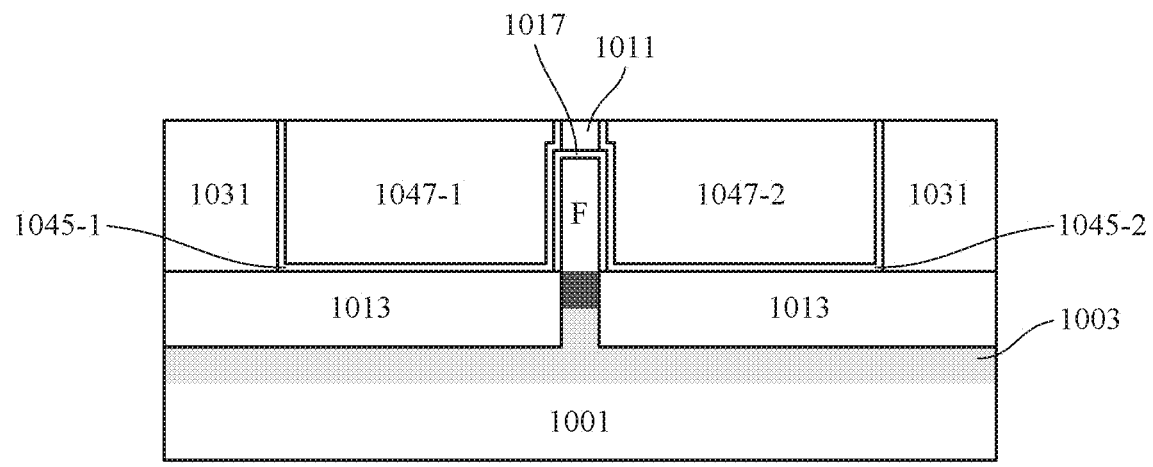
Figure 2M:
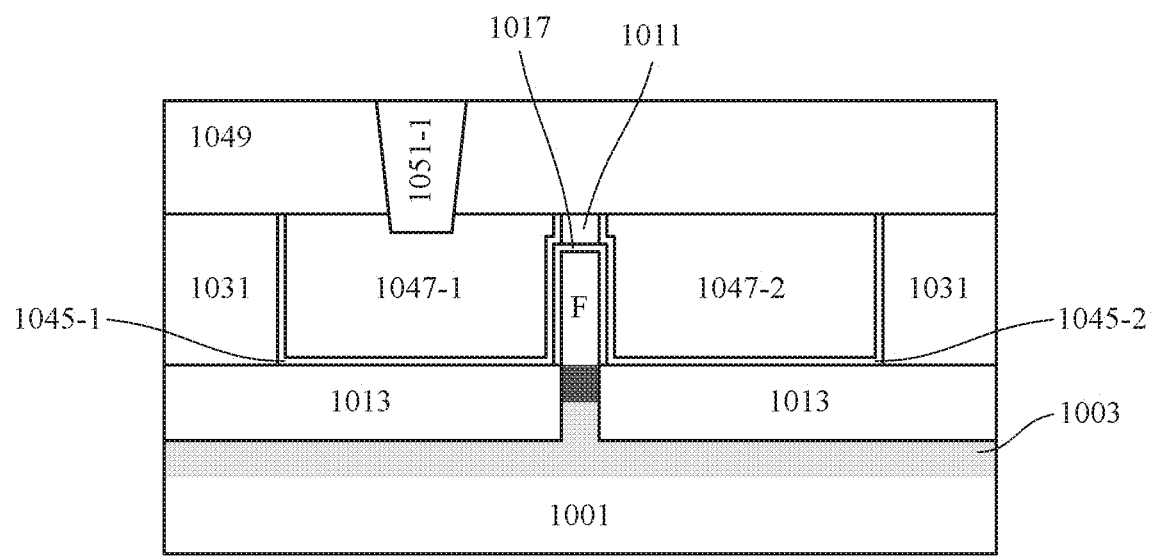
Figure 2N:
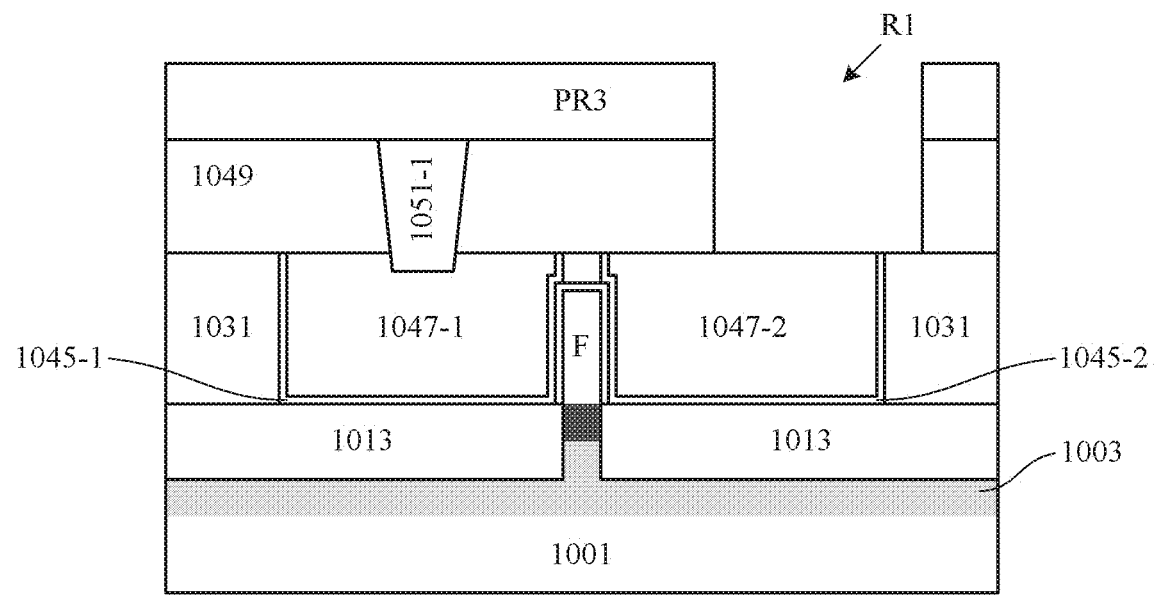
Figure 2O:
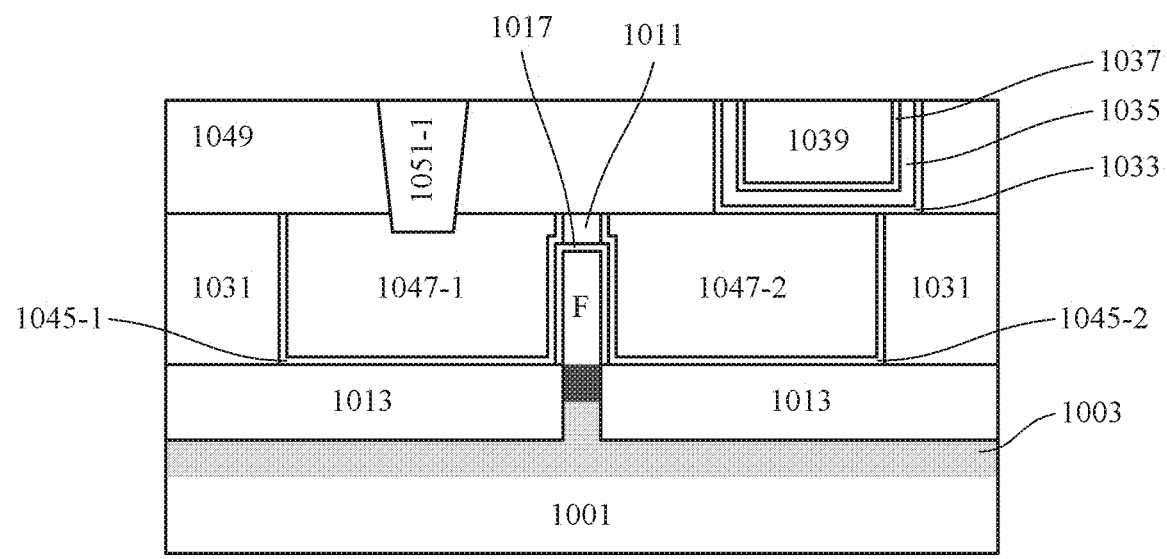
Figure 2P:
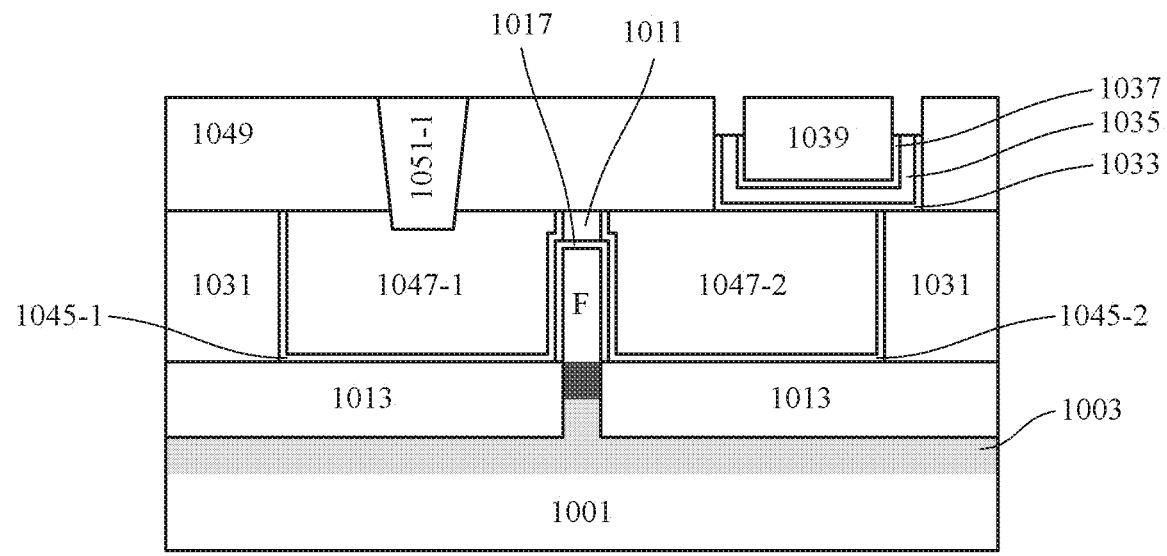
Figure 2Q:
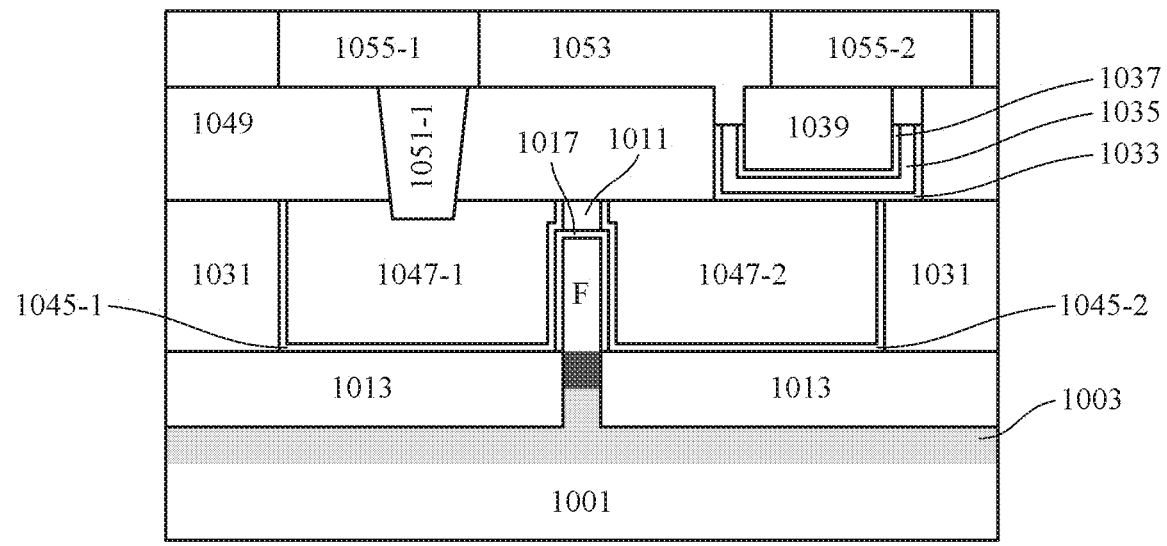

FIGS. 2(a)-2(q) are sectional views illustrating some of phases in a flow of manufacturing a FinFET according to an embodiment of the present disclosure.

As shown in FIG. 2(a), a substrate 1001 is provided. Here, a silicon wafer is described by way of example to exemplify a bulk FinFET. However, the present disclosure is not limited thereto, but may be applied to other forms of substrates.

In the substrate 1001, a well region 1003 may be formed. For example, such a well region may be formed by ion implantation and annealing. If an n-type device is to be formed, a p-type well region may be formed; or if a p-type device is to be formed, an n-type well region may be formed. For example, the n-type well region may be formed by implanting n-type ions such as P or As into the substrate 1001, and the p-type well region may be formed by implanting p-type ions such as $BF_2$ or In into the substrate 1001. In this example, the well region 1003 is located inside the substrate 1001.

On the substrate 1001 having the well region 1003 formed therein, a fin extending in a first direction (in this example, a direction perpendicular to the sheet) may be formed by patterning the substrate 1001.

According to an embodiment of the present disclosure, the fin may be formed by the pattern transfer technique. Specifically, an amorphous silicon layer 1007 may be formed on the substrate 1001 by, for example, deposition such as Chemical Vapor Deposition (CVD), Atomic Layer Deposition (ALD), or the like. In addition, an etching stop layer 1005 may be formed on a surface of the substrate 1001 by, for example, deposition, before the formation of these material layers. For example, the etching stop layer 1005 may comprise oxide (for example, silicon oxide) with a thickness of about 1-5 nm; and the amorphous silicon layer 1007 may have a thickness of about 50-150 nm.

Then, as shown in FIG. 2(b), photoresist PR1 patterned by, for example, photolithography (for example, exposure and development) may be formed on the amorphous silicon layer 1007, and then the amorphous silicon layer 1007 is patterned by, for example, Reactive Ion Etching (RIE) with the photoresist PR1 as a mask. The RIE may stop at the etching stop layer 1005. Then, the photoresist PR1 may be removed. The patterned amorphous silicon layer 1007 may have a sidewall extending in the first direction, which is at a position corresponding to one sidewall of the fin to be subsequently formed.

Next, as shown in FIG. 2(c), a spacer 1011 may be formed on the sidewall of the patterned amorphous silicon layer 1007. For example, the spacer 1011 may comprise nitride, with a width (i.e., a dimension in a horizontal direction in the figure) of about 5-30 nm. Such a spacer may be formed by, for example, depositing a nitride layer in a substantially conformal manner, and then processing the deposited nitride layer by RIE in a direction substantially perpendicular to the surface of the substrate to remove laterally extending portions thereof so that vertically extending portions thereof are remained. An area occupied by the spacer 1011 corresponds to an area where the fin is to be formed. Then, the amorphous silicon layer 1007 may be removed by selective etching such as RIE. In this way, the spacer 1011 extending in the first direction is obtained, and may serve as a hard mask for forming the fin. Certainly, the spacer 1011 may be further patterned by, for example, RIE to define its length in the first direction.

Subsequently, as shown in FIG. 2(d), the substrate 1001 may be patterned with the spacer 1011 as a mask to form the fin. Specifically, the etching stop layer 1005 and the substrate 1001 may be selectively etched in sequence by, for example, RIE. Preferably, etching of the substrate 1001 may proceed into the well region 1003.

Thus, relative to a portion of the substrate under the spacer 1011, remaining portions of the substrate may have their surfaces recessed, thereby forming a protruding fin F on the substrate 1001.

Certainly, a manner of forming the fin is not limited thereto. For example, the fin may be formed by forming, on the substrate 1001, photoresist corresponding in shape to the fin to be formed and patterning the substrate 1001 by, for example, RIE, using the photoresist.

Next, a gate intersecting the fin may be formed on the substrate having the fin formed thereon. In the following description, the replacement gate process is described by way of example.

In the present example (i.e., the silicon wafer), an isolation layer may be formed firstly to isolate the gate from the substrate. Specifically, as shown in FIG. 2(e), an oxide layer 1013 may be formed on the substrate by deposition such as CVD, and the oxide layer is planarized by, for example, Chemical Mechanical Polishing (CMP). The planarization process may stop at the spacer 1011. Next, as shown in FIG. 2(*f*), the oxide layer 1013 may be etched back (for example, by wet etching such as diluted HF acid or by HF vapor) to form the isolation layer. The isolation layer 1013 has a top surface lower than that of the fin F, and preferably not lower than that of the well region 1003.

In addition, a Punch-through Stopper (PTS) layer may also be formed to improve the device performance. For example, as shown by arrows in FIG. 2(*f*), ion implantation may be performed in a direction substantially perpendicular to the surface of the substrate. For an n-type device to be formed, p-type ions may be implanted; and for a p-type device to be formed, n-type ions may be implanted. Energy of the ion implantation may be controlled so that the ions can hardly reach the substrate 1001 directly through various layers on the substrate 1001. However, due to scattering of the implanted ions by the isolation layer 1013, a part of the scattered ions may enter the substrate 1001 as indicated by the oblique arrows in the figure. The ions may be activated by annealing, so that these scattered ions may form a doped region 1015 in the substrate 1001, as shown in FIG. 2(*g*), which may then act as the PTS. As the doped region 1015 is formed due to the scattering by the isolation layer 1013, its top surface may be substantially flush with (or slightly higher than, due to some factors such as upward scattering and/or diffusion) the top surface of the isolation layer 1013.

Next, as shown in FIG. 2(*h*), a sacrificial material layer 1019 may be formed on the isolation layer 1013. For example, polysilicon may be formed by deposition, and the deposited polysilicon layer may be planarized by, for example, CMP, wherein the CMP may stop at the spacer 1011. Then the polysilicon layer is etched back to form the sacrificial material layer 1019. Here, the sacrificial material layer 1019 preferably has a top surface higher than that of the fin F. Thus, it is ensured in the subsequent replacement gate process that a portion of the spacer 1011 may be remained on the top of the fin. In addition, it is also ensured that a first gate and a second gate to be subsequently formed may be in contact with the entire height of sidewalls of the fin. On the other hand, the first sacrificial material layer 1019 preferably has a top surface lower than that of the spacer 1011, which helps to separate the first gate from the second gate. That is, the top surface of the sacrificial material layer 1019 may be located at a level between the top surface and the bottom surface of the spacer 1011. In addition, an interfacial layer 1017 may be formed on the sidewalls of the fin F before the formation of the sacrificial material layer 1019. For example, the interfacial layer 1017 may comprise oxide with a thickness of about 1-3 nm. In this example, as both the interfacial layer 1017 and the etching stop layer 1005 are oxide, the interfacial layer 1017 and the etching stop layer 1005 are together indicated as 1017.

The sacrificial material layer 1019 may then be patterned to form a sacrificial gate. For example, as shown in the top view of FIG. 2(*i*) and the sectional view of 2(*i'*) (a sectional view taken along line AA' in FIG. 2(*i*)), photoresist PR2 may be formed on the sacrificial material layer 1019. The photoresist PR2 may be formed in a shape corresponding to the sacrificial gate to be formed by photolithography (for example, exposure, development, etc.) Specifically, as shown in FIGS. 2(*i*) and 2(*i'*), the photoresist PR2 may be patterned into a bar shape extending in a direction (a horizontal direction in the figure) crossing (for example, perpendicular to) the fin F (defined by the spacer 1011). Then, as shown in FIG. 2(*j*), the sacrificial material layer 1019 may be selectively etched by, for example, RIE with the patterned photoresist PR2 as a mask. Thus, the sacrificial material layer 1019 constitutes a sacrificial gate, which has a bar shape extending in the direction crossing (for example, perpendicular to) the fin F as the patterned photoresist PR2.

After the fin F and the sacrificial gate 1019 are formed as described above, other elements of the device may be manufactured. For example, a gate spacer may be formed on sidewalls of the sacrificial gate, source/drain implantation (or strained source/drain may be formed by epitaxially growing a semiconductor layer) may be performed, or the like. It is well known to those skilled in the art to manufacture the FinFET using the replacement gate process, which will not be described in detail here.

The sacrificial gate may then be removed to form a final gate structure, comprising the first gate and the second gate.

Specifically, as shown in FIG. 2(*k*), a further dielectric layer 1031 (for example, oxide) may be formed on the isolation layer 1013. For example, oxide may be deposited on the structure shown in FIG. 2(*j*) and then planarized by, for example, CMP, to form the dielectric layer 1031. The CMP may stop at the sacrificial material layer 1019, to expose the sacrificial material layer 1019 for subsequent replacement thereof. As described above, as the sacrificial material layer 1019 has its top surface higher than that of the fin F, a portion of the spacer 1011 is remained on the top of the fin F after the CMP. The fin F and the spacer 1011 on top thereof divide the sacrificial material layer 1019 into two portions on the first side (for example, a left side in the figure) and the second side (for example, a right side in the figure) of the fin F.

Next, as shown in FIG. 2(1), the sacrificial material layer 1019 may be removed by selective etching (by, for example, a Tetramethylammonium hydroxide (TMAH) solution). Thus, a gate trench (which is in a space originally occupied by the sacrificial material layer 1019) (not shown) is left on the first side and the second side (the right side in the figure) of the fin F. A material stack for the gate may then be filled in the gate trench. For example, gate dielectric layers 1045-1/1045-2 and gate electrode layers 1047-1/1047-2 may be formed in sequence. For example, the gate dielectric layer may comprise a high-K gate dielectric such as $HfO_2$ with a thickness of about 1-5 nm, and the gate electrode layer may comprise conductive metal such as W. For example, the gate dielectric layer may be deposited in a substantially conformal manner, and the gate electrode layer may be deposited to fill up the gate trench, and then planarization, for example, CMP may be performed (with the spacer 1011 as a stop point) to fill these layers in the gate trench. The interfacial layer may be reconstructed before the formation of the gate dielectric layer. In addition, a gate work function adjustment layer (not shown) may further be formed between the gate dielectric layer and the gate electrode layer.

Thus, the first gate (1045-1 and 1047-1) is formed on the first side of the fin F, and the second gate (1045-2 and 1047-2) is formed on the second side of the fin F, respectively. For example, one of the first gate and the second gate may act as a control gate and the other of the first gate and the second gate may act as a back gate.

Next, a metallization stack may be formed.

For example, as shown in FIG. 2(*m*), an interlayer dielectric layer 1049 (for example, oxide) may be formed on the structure shown in FIG. 2(1) by, for example, deposition. A contact 1051-1 may be formed at a position corresponding to the first gate. The contact may be formed, for example, by etching the interlayer dielectric layer to form a contact hole, and filling the contact hole with a conductive material layer (for example, W). Likewise, a contact may be formed at a position corresponding to a source/drain region (not shown). Certainly, it is also possible to firstly form a (conductive) diffusion barrier layer such as TiN on side and bottom walls of the contact hole, and then fill the contact hole with a conductive material.

A negative capacitor may be formed in the interlayer dielectric layer 1049.

For example, as shown in FIG. 2(*n*), photoresist PR3 may be formed on the interlayer dielectric layer 1049 having the contact formed therein. The photoresist PR3 may be patterned by photolithography to expose a portion of the interlayer dielectric layer 1049, where the negative capacitor is to be formed. Capacitance of the subsequently formed negative capacitor may be adjusted by adjusting a size of the portion exposed by the photoresist PR3. Then, the interlayer dielectric layer 1049 is selectively etched by, for example, RIE with the patterned photoresist PR3 as a mask, until the second gate (specifically, the gate electrode layer 1047-2 thereof) is exposed, thereby forming a trench R1 in the interlayer dielectric layer 1049. Here, the trench R1 is preferably biased to a side (i.e., the right side in the figure) opposite to the first gate. After that, the photoresist PR3 may be removed.

Subsequently, various material layers may be filled in the trench R1 to form the negative capacitor. For example, as shown in FIG. 2(*o*), a stack configuration of a first conductive layer-a negative capacitance material layer-a second conductive layer may be formed in sequence in the trench R1. In the example of FIG. 2(*o*), the first conductive layer may comprise a TiN layer 1033 (for example, with a thickness of about 1-5 nm, which may be formed by ALD). The TiN layer 1033, on one hand, acts as a plate of the negative capacitor due to its electrical conductivity, and on the other hand may also act as a diffusion barrier layer. The first conductive layer may also comprise one or more ohmic contact layers such as metal (for example, W or the like) of a low ohmic resistance, if desired (for example, to reduce contact resistance). The negative capacitance material layer may comprise an $HfZrO_2$ layer 1035 (for example, with a thickness of about 2-100 nm, which may be formed by ALD). The second conductive layer may comprise a TiN layer 1037 (for example, with a thickness of about 1-5 nm, which may be formed by ALD) and an ohmic contact layer 1039 (for example, metal such as W, which may be formed by ALD or CVD), to act as another plate of the capacitor. Here, the TiN layer 1037 mainly acts as a diffusion barrier layer (which may be omitted), and the ohmic contact layer 1039 may be in contact with other contact components to be subsequently formed (for example, see 1055-2 shown in FIG. 2(*q*)). For example, the TiN layer 1033, the $HfZrO_2$ layer 1035, and the TiN layer 1037 may be deposited in sequence in a substantially conformal manner, and the ohmic contact layer 1039 may be deposited to fill up the trench R1, and then planarization, for example, CMP, may be performed to fill the trench R1 with these layers.

In this example, one plate (1033) of the negative capacitor (1033, 1035, 1037 and 1039) is in direct contact with the gate electrode layer 1047-2 and is thus connected to the second gate.

Next, other layers in the metallization stack may be further formed. In this example, as metal interconnections (see FIG. 2(*q*)) are formed in an upper layer of the interlayer dielectric layer 1049, the TiN layer 1033, the $HfZrO_2$ layer 1035, and the TiN layer 1037 may be etched back by selective etching such as RIE, so that they are recessed, as shown in FIG. 2(*p*). Subsequently, as shown in FIG. 2(*q*), another interlayer dielectric layer 1053 (for example, oxide) is formed on the interlayer dielectric layer 1049. Metal interconnections 1055-1 and 1055-2 corresponding to the contact 1051-1 and the ohmic contact layer 1039 may be formed in the interlayer dielectric layer 1053. The metal interconnections 1055-1 and 1055-2 each may extend in a certain route in the interlayer dielectric layer 1053 to electrically connect the contact 1051-1 and the ohmic contact layer 1039 (the other plate of the negative capacitor) to other components. As the TiN layer 1033, the $HfZrO_2$ layer 1035 and the TiN layer 1037 are recessed and the recesses are filled with the interlayer dielectric layer 1053, unwanted electrical connections between these layers and the metal interconnection 1055-2 can be avoided.

In the above example, the trench R1 is biased to one side (the right side in the figure) of the second gate. Certainly, the present disclosure is not limited thereto. For example, the trench R1 may also be located directly above the second gate (the trench R1 may have a width less than that of the second gate). In addition, conductive vias may be formed in the interlayer dielectric layer 1053 (the metal interconnections may be formed in a further upper layer), and the conductive vias may be aligned with the contact 1051-1 and the gate electrode layer 1047-2, or the like, respectively. In this case, it is not necessary to recess the TiN layer 1033, the $HfZrO_2$ layer 1035, and the TiN layer 1037 as described above. In addition, the negative capacitor may be formed on a further upper layer in the metallization stack and connected to the second gate through conductive via(s) and/or metal interconnection(s).

FIGS. 3(*a*)-3(*m*) are sectional views illustrating some of phases in a flow of manufacturing a FinFET according to another embodiment of the present disclosure.

As shown in FIG. 3(*a*), a substrate 2001 is provided. Here, an SOI substrate is described by way of example to exemplify an SOI FinFET. Specifically, the SOI substrate 2001 may comprise a base substrate 2001-1 (for example, silicon), a buried insulating layer 2001-2 (for example, oxide), and an SOI layer 2001-3 (for example, silicon).

An etching stop layer 2005 and an amorphous silicon layer 2007 may be formed in sequence on the substrate 2001. For the etching stop layer 2005 and the amorphous silicon layer 2007, reference can be made to the above description of the etching stop layer 1005 and the amorphous silicon layer 1007.

As shown in FIG. 3(*b*), the amorphous silicon layer 2007 may be patterned by, for example, RIE using patterned photoresist PR4 to form a sidewall extending in a first direction, which is at a position corresponding to one sidewall of a fin to be subsequently formed. The RIE may stop at the etching stop layer 2005. For this, reference can be made to the above description in conjunction with FIG. 2(*b*).

A hard mask for defining the fin may then be formed. For example, as shown in FIG. 3(*c*), a spacer 2011 may be formed on the sidewall of the patterned amorphous silicon layer 2007. For this, reference can be made to the above description in conjunction with FIG. 2(*c*).

After that, as shown in FIG. 3(*d*), the etching stop layer 2005 (if any) and the substrate 2001 (specifically, the SOI layer 2001-3) may be selectively etched by, for example, RIE, in sequence with the spacer 2011 as a mask to form the fin. Here, the etching of the substrate 2001 may stop at the buried insulating layer 2001-2.

Thus, relative to a portion of the substrate under the spacer 2011, remaining portions of the substrate may have their surfaces recessed, thereby forming a protruding fin F on the substrate 2001. Next, a gate intersecting the fin F may be formed on the substrate having the fin formed thereon. As this example is directed to the SOI substrate, it is not necessary to separately form an isolation layer.

Figure 3A:
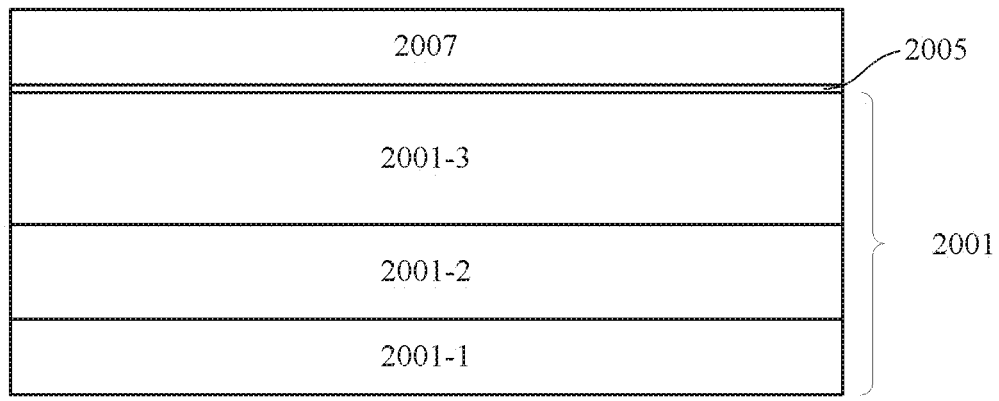
FIGS. 3(a)-3(m) are sectional views illustrating some of phases in a flow of manufacturing a FinFET according to another embodiment of the present disclosure.
Figure 3B:
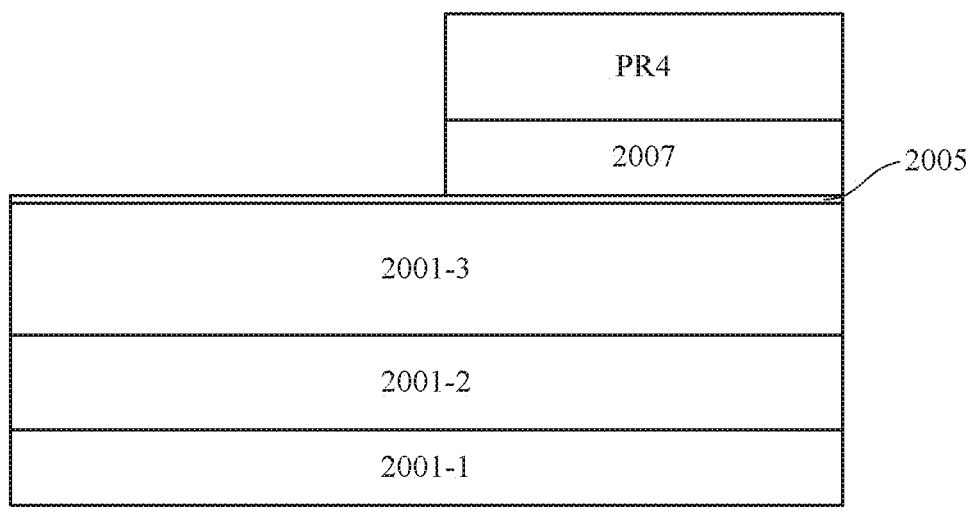
Figure 3C:
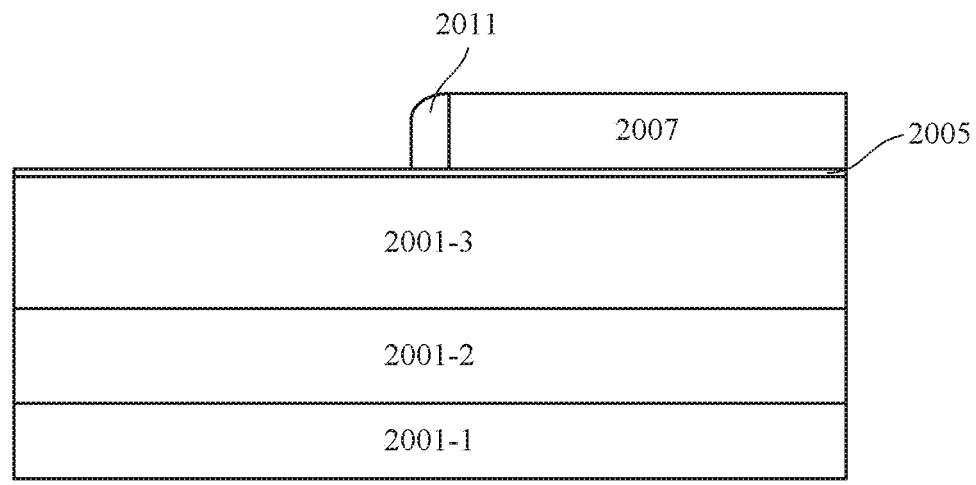
Figure 3D:
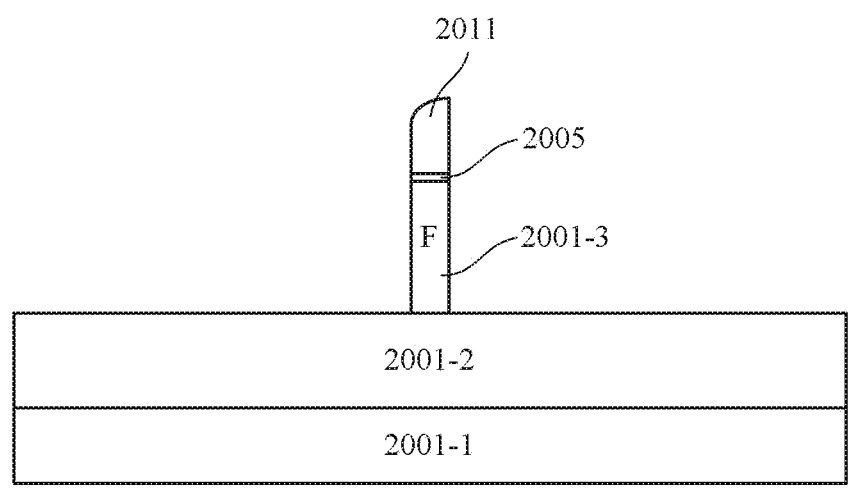
Figure 3E:
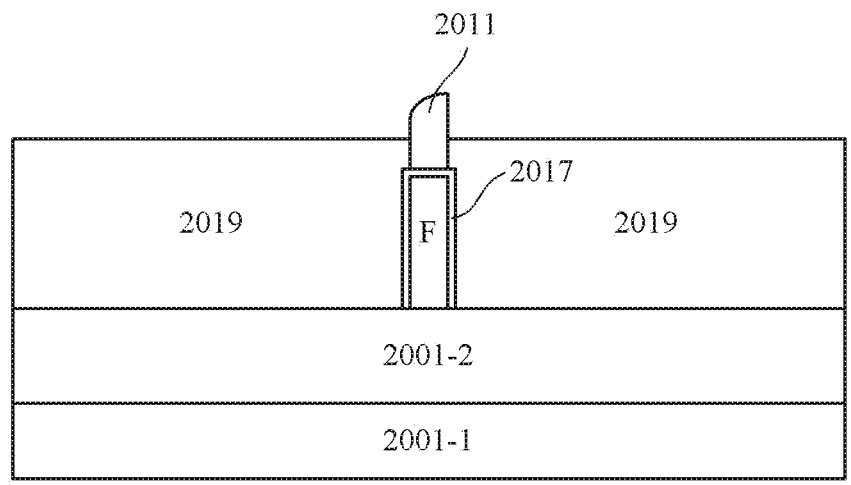

As shown in FIG. 3(e), a sacrificial material layer 2019 may be formed on the buried insulating layer 2001-2. In addition, an interfacial layer 2017 may be formed on sidewalls of the fin F before the formation of the sacrificial material layer 2019. For this, reference can be made to the description above in connection with FIG. 2(h).

The sacrificial material layer 2019 may then be patterned to form a sacrificial gate.

Figure 3F:
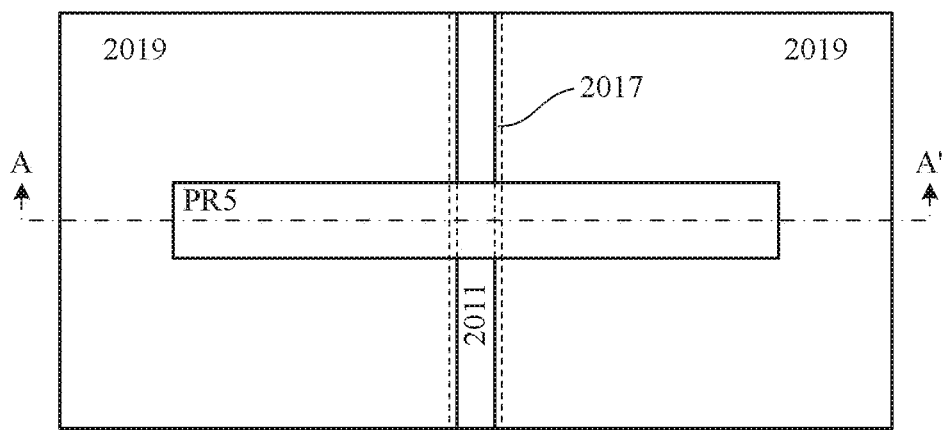
Figure 3G:
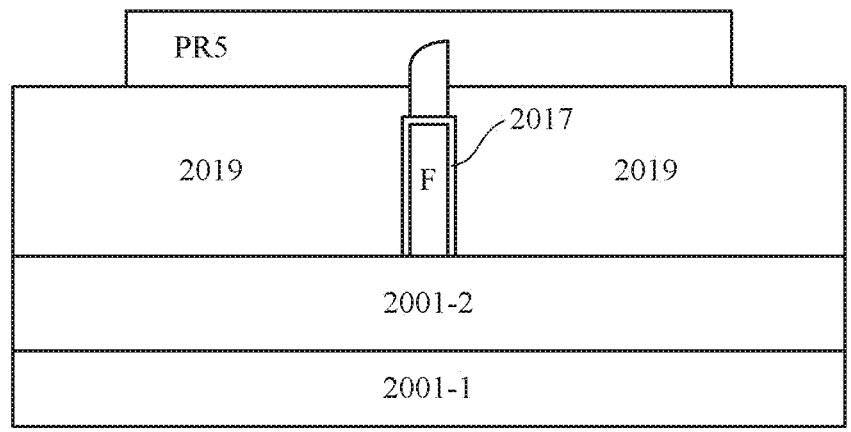
Figure 3G:
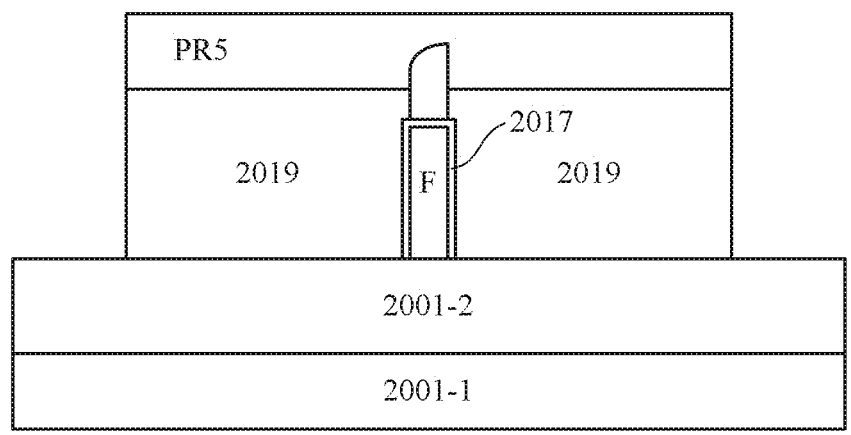

To do this, as shown in the top view of FIG. 3(f) and the sectional view of FIG. 3(f) (a sectional view taken along line AA' in FIG. 3(f)), photoresist PR5 may be formed on the sacrificial material layer 2019. The photoresist PR5 may be formed in a shape corresponding to the sacrificial gate to be formed by photolithography (for example, exposure, development, etc.) For this, reference can be made to the above description in connection with FIGS. 2(i) and 2(i'). Then, as shown in FIG. 3(g), the sacrificial material layer 2019 may be selectively etched by, for example, RIE with the patterned photoresist PR5 as a mask. The RIE may stop at the buried insulating layer 2001-2. Thus, the sacrificial material layer 2019 constitutes the sacrificial gate which has a bar shape extending in a direction crossing (for example, perpendicular to) the fin F.

After the fin F and the sacrificial gate are formed as described above, other elements of the device may be manufactured. After that, the sacrificial gate may be removed to form a final gate structure comprising a first gate and a second gate.

Figure 3H:
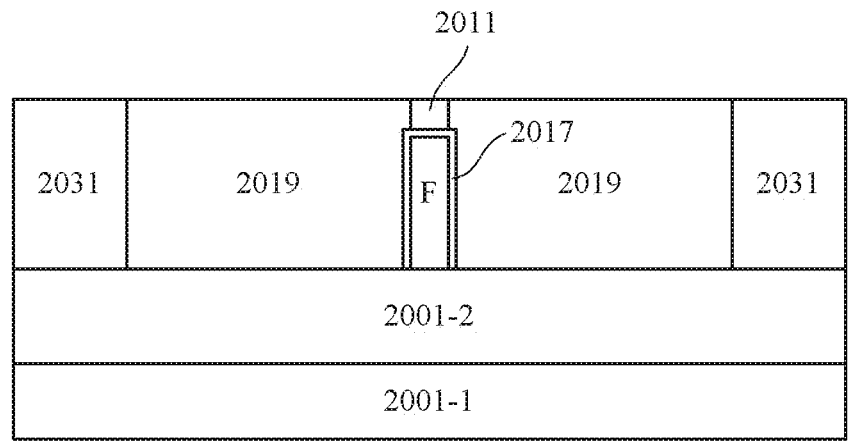
Figure 3I:
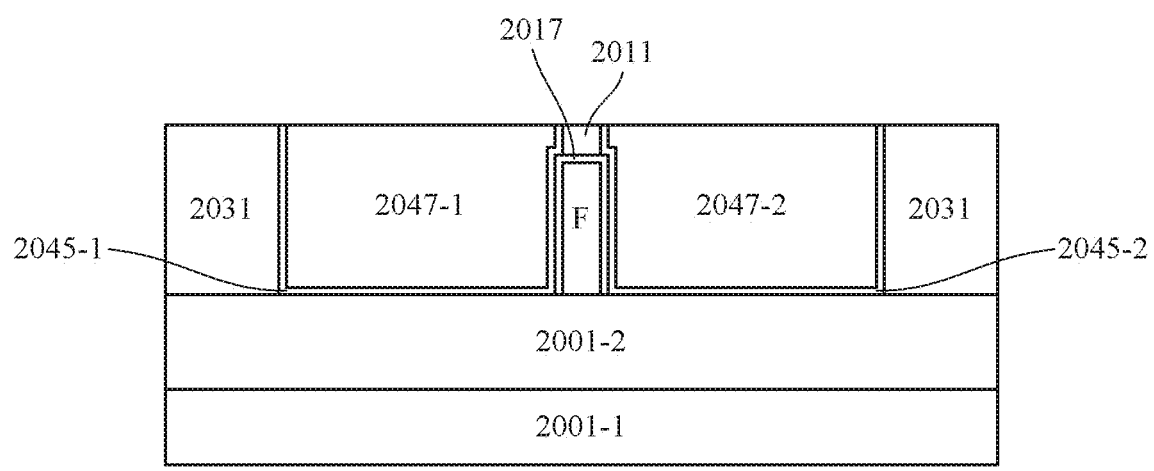

Specifically, as shown in FIG. 3(h), a further dielectric layer 2031 (for example, oxide) may be formed on the buried insulating layer 2001-2. Then, the sacrificial material layer 2019 is removed, and the first gate and the second gate are filled in spaces left on opposite sides of the fin F due to their removal, respectively. As shown in FIG. 3(i), the first gate may comprise a gate dielectric layer 2045-1 and a gate electrode layer 2047-1, and the second gate may comprise a gate dielectric layer 2045-2 and a gate electrode layer 2047-2. The first gate and the second gate may have substantially the same stack configuration. For this, reference can be made to the description above in connection with FIGS. 2(k) and 2(1).

Next, a metallization stack may be manufactured and a negative capacitor may be formed therein.

Figure 3J:
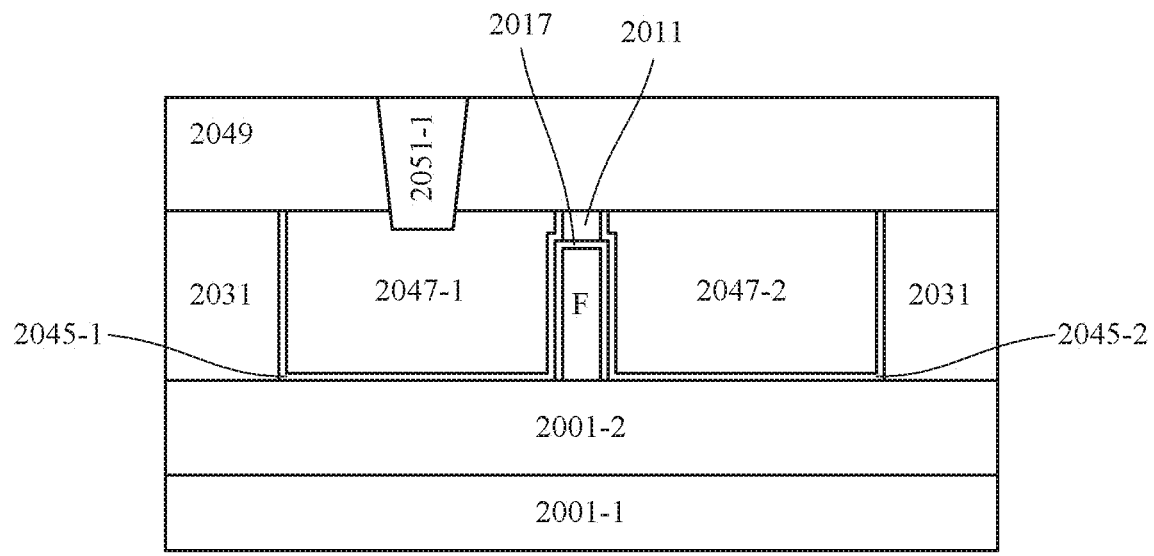
Figure 3K:
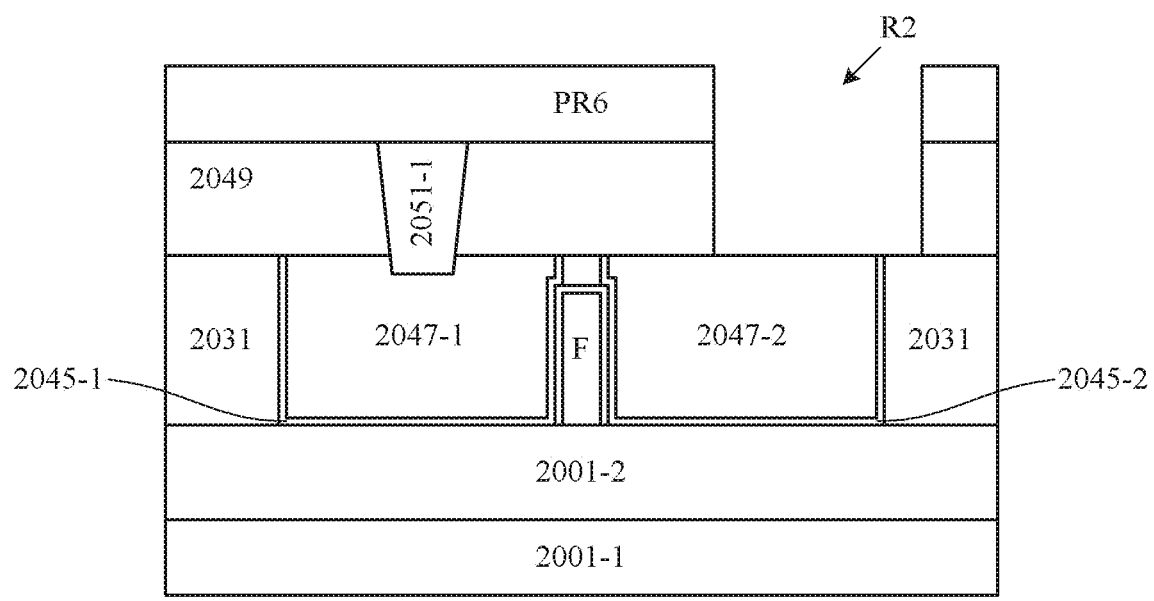
Figure 3L:
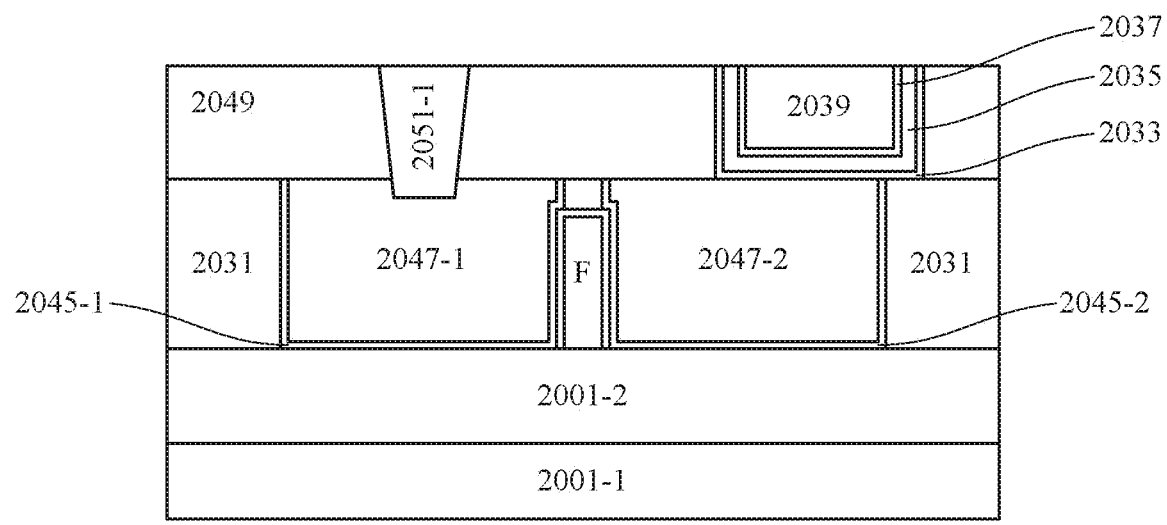
Figure 3M:
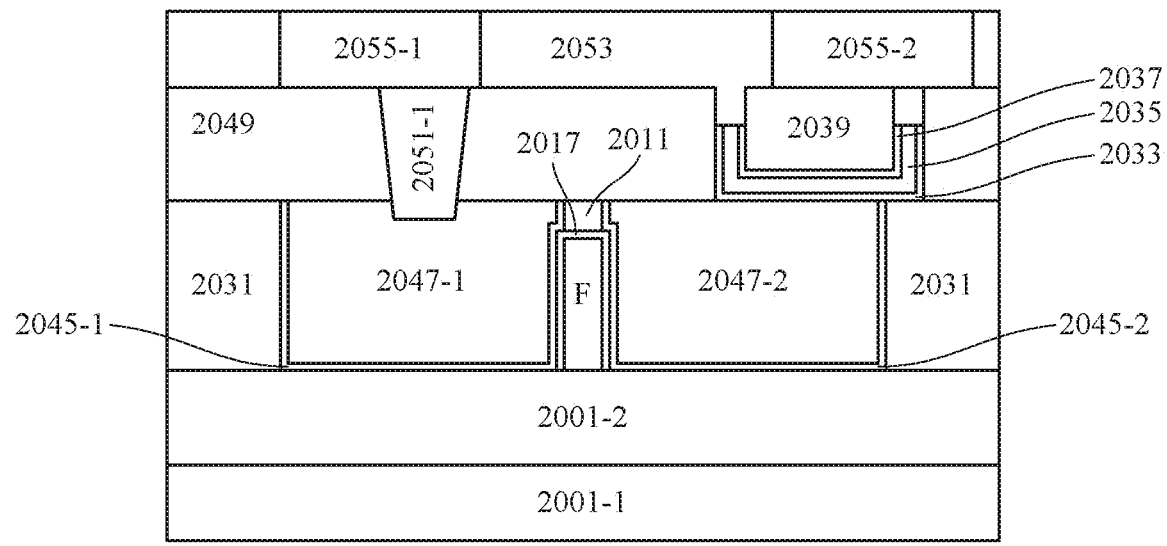

For example, as shown in FIG. 3(j), an interlayer dielectric layer 2049 (for example, oxide) may be formed on the structure shown in FIG. 3(i) by, for example, deposition. A contact 2051-1 may be formed at a position corresponding to the first gate. Further, as shown in FIG. 3(k), a trench R2 may be formed in the interlayer dielectric layer 2049 using patterned photoresist PR6. A negative capacitor may be formed by filling the trench R2 with various material layers. For example, as shown in FIG. 3(1), a stack configuration of a first conductive layer-a negative capacitance material layer-a second conductive layer may be formed in sequence in the trench R2. In the example of FIG. 3(1), the first conductive layer may comprise a TiN layer 2033 (for example, with a thickness of about 1-5 nm), the negative capacitance material layer may comprise a $HfZrO_2$ layer 2035 (for example, with a thickness of about 2-100 nm), and the second conductive layer may comprise a TiN layer 2037 (for example, with a thickness of about 1-5 nm) and an ohmic contact layer 2039 (for example, metal such as W). After that, metal interconnections 2055-1 and 2055-2 may also be formed in another interlayer dielectric layer 2053 as shown in FIG. 3(m). For this, reference can be made to the above description in connection with FIGS. 2(m)-2(q).

The semiconductor devices according to the embodiments of the present disclosure are applicable to various electronic devices. For example, an Integrated Circuit (IC) may be formed by integrating a plurality of such semiconductor devices and other devices (for example, transistors in other forms etc.), from which an electronic device may be made. Therefore, the present disclosure further provides an electronic device comprising the above semiconductor device. The electronic device may also comprise components such as a display operatively coupled to the integrated circuit and a wireless transceiver operatively coupled to the integrated circuit, etc. Such an electronic device may comprise, for example, a smart phone, a tablet Personal Computer (PC), a Personal Digital Assistant (PDA), etc.

According to an embodiment of the present disclosure, there is also provided a method of manufacturing a System on Chip (SoC). The method may comprise the above method of manufacturing the semiconductor device. In particular, a number of various devices may be integrated on a chip, and at least some of the devices are manufactured by the method according to the present disclosure.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

The present disclosure is described above with reference to the embodiments thereof. However, those embodiments are provided only for illustrative purpose, rather than limiting the present disclosure. The scope of the disclosure is defined by the attached claims as well as equivalents thereof. Those skilled in the art can make various alternations and modifications without departing from the scope of the disclosure, which all fall within the scope of the disclosure.

What is claimed is:

1. A Fin Field Effect Transistor (FinFET), comprising:
a fin extending in a first direction on a substrate;
a first gate extending in a second direction crossing the first direction on the substrate on a first side of the fin to intersect the fin;
a second gate opposite to the first gate and extending in the second direction on the substrate on a second side of the fin opposite to the first side to intersect the fin;
a metallization stack provided on the substrate and above the fin and the first and second gates; and
a negative capacitor formed in the metallization stack and connected to the second gate,
wherein the negative capacitor has a capacitance whose absolute value is less than that of a second gate capacitor caused by the second gate.

2. The FinFET according to claim 1, wherein the negative capacitor is formed as a trench capacitor in an interlayer dielectric layer included in the metallization stack.

3. The FinFET according to claim 1, wherein the negative capacitor and the second gate capacitor produce a series capacitance whose absolute value is approximately equal to that of a first gate capacitor caused by the first gate.

4. The FinFET according to claim 1, wherein the absolute value of the capacitance of the negative capacitor is about ½ that of the second gate capacitor.

5. The FinFET according to claim 1, further comprising a dielectric layer on the top of the fin, wherein the first gate and the second gate are spaced apart from each other by the fin and also the dielectric layer on the top of the fin.

6. The FinFET according to claim 1, wherein the first gate and the second gate have substantially the same stack configuration.

7. The FinFET according to claim 1, wherein the negative capacitor comprises a stack of a first conductive layer, a negative capacitance material layer, and a second conductive layer.

8. The FinFET according to claim 7, wherein the first conductive layer is in contact with the second gate.

9. The FinFET according to claim 7, wherein at least one of the first conductive layer and the second conductive layer comprises TiN.

10. The FinFET according to claim 7, wherein at least one of the first conductive layer and the second conductive layer comprises a stack of conductive materials.

11. The FinFET according to claim 7, wherein the negative capacitance material layer comprises a ferroelectric material.

12. The FinFET according to claim 11, wherein the negative capacitance material layer comprises a material containing Zr, Ba or Sr.

13. The FinFET according to claim 12, wherein the negative capacitance material layer comprises $HfZrO_2$, $BaTiO_3$, $KH_2PO_4$, NBT or any combination thereof.

14. The FinFET according to claim 1, wherein the substrate is a bulk semiconductor substrate, and the FinFET further comprises a punch-through stopper layer formed in a portion of the substrate under the fin.

15. The FinFET according to claim 1, wherein the substrate is a Semiconductor-On-Insulator (SOI) substrate, and the fin is formed in an SOI layer of the SOI substrate.

16. An electronic device comprising an integrated circuit formed of the FinFET according to claim 1.

17. The electronic device according to claim 16, further comprising a display operatively coupled to the integrated circuit and a wireless transceiver operatively coupled to the integrated circuit.

* * * * *

UNITED STATES PATENT AND TRADEMARK OFFICE
CERTIFICATE OF CORRECTION

PATENT NO. : 10,797,178 B2  
APPLICATION NO. : 16/054809  
DATED : October 6, 2020  
INVENTOR(S) : Huilong Zhu et al.

Page 1 of 1

It is certified that error appears in the above-identified patent and that said Letters Patent is hereby corrected as shown below:

On the Title Page

On Page 2, Column 2, Item (56), Line 3, under Other Publications, delete "Electro" and insert --Electron--.

Signed and Sealed this
Second Day of March, 2021

Drew Hirshfeld
*Performing the Functions and Duties of the
Under Secretary of Commerce for Intellectual Property and
Director of the United States Patent and Trademark Office*